United States Patent [19]
Numata et al.

[11] Patent Number: 5,008,888
[45] Date of Patent: Apr. 16, 1991

[54] SEMICONDUCTOR LASER DRIVING APPARATUS

[75] Inventors: Tomiyuki Numata, Tenri; Takashi Iwaki, Nara; Kunio Kojima, Nara; Toshihisa DeGuchi, Nara, all of Japan

[73] Assignee: Sharp Kabushiki Kaisha, Osaka, Japan

[21] Appl. No.: 384,213

[22] Filed: Jul. 21, 1989

[30] Foreign Application Priority Data

Jul. 22, 1988 [JP] Japan ................................ 63-184088

[51] Int. Cl.$^5$ .............................................. H01S 3/10
[52] U.S. Cl. ......................................... 372/29; 372/38
[58] Field of Search ...................... 372/29, 38; 369/116

[56] References Cited

U.S. PATENT DOCUMENTS 4,813,034 3/1989 Mashimo ............................ 372/29

FOREIGN PATENT DOCUMENTS

62-257640 5/1986 Japan .

Primary Examiner—James W. Davie
Attorney, Agent, or Firm—Irell & Manella

[57] ABSTRACT

A semiconductor laser driving apparatus for supplying a driving current to a semiconductor laser device of an optical disk recording and reproducing system, the level of which is changed to adjust the optical output of the laser device to one of plural levels corresponding to positions of an optical disk which is irradiated by a laser beam emitted from the laser device. The apparatus comprises: a current source for sequentially supplying plural reference driving currents having a different predetermined level to the laser device; a monitor for detecting the optical output level of the laser device when each of the reference driving currents is supplied to the laser device; a setting device for setting several optimum values on the basis of the detected optical output levels; a selecting device for selecting one of the several optimum values, depending upon the position of an optical disk where is to be irradiated by a laser beam; and said current source for supplying a driving current for recording information on an optical disk, to the laser device, the level of the driving current corresponding to the selected optimum value.

5 Claims, 8 Drawing Sheets

SEMICONDUCTOR LASER DRIVING APPARATUS

BACKGROUND OF THE INVENTION

1. Field of the Invention

This invention relates to a semiconductor laser driving apparatus, and more particularly to a semiconductor laser driving apparatus useful in an optical disk recording and reproducing system wherein information is recorded on and reproduced from a optical disk such as a magnetooptical disk.

2. Description of the Prior Art

In an optical disk recording and reproducing system, information is recorded in and reproduced from an optical disk such as a rewritable type magnetooptical disk. Hereinafter, description will be made, taking a rewritable type magnetooptical disk as a typical example of an optical disk. However, the invention can be also applicable to a semiconductor laser driving apparatus for an optical disk of another type such as a write-once type one or phase-transition type one.

When information is to be recorded on or erased from a magnetooptical disk comprising a magnetic thin film, a high power laser light beam is irradiated onto the disk to elevate locally the temperature of the magnetic thin film which has been perpendicularly magnetized, thereby causing the magnetization of the magnetic thin film to invert in the direction of an external magnetic field. In contrast, when information is to be reproduced from the magnetooptical disk, a low power laser light beam is irradiated to the disk to detect the variation in a reflected light beam polarization which corresponds to the state of the magnetization of the magnetic film. Hence, an optical disk recording and reproducing system is provided with a semiconductor laser driving apparatus which supplies a driving current to a semiconductor laser device the level of which is controlled in accordance with the operating modes of the system (i.e., the recording and erasing mode or the reproducing mode).

Figure 7:
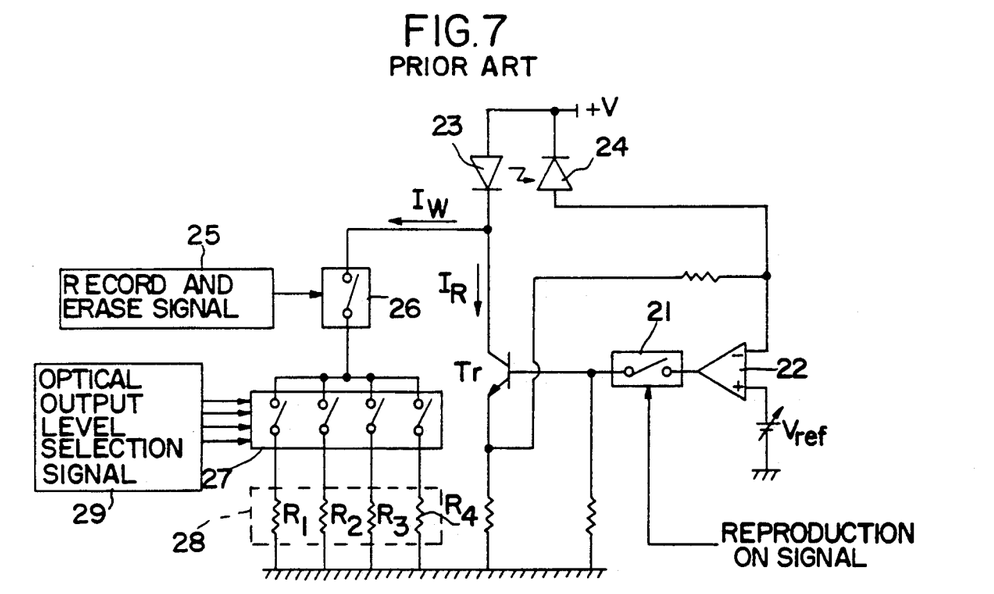
FIG. 7 is a circuit diagram of a conventional semiconductor laser driving apparatus.

FIG. 7 shows a prior art semiconductor laser driving apparatus. In the reproducing mode, a switch circuit 21 is closed by the reproduction ON signal. Then, the output of an operational amplifier 22 to which a power source $V_{ref}$ is connected via the non-inverting input, is supplied to a transistor Tr to turn it ON, thereby a reproduction driving current $I_R$ is supplied to a semiconductor laser device 23 to emit a laser light beam. The laser light beam is monitored by an optical detecting element 24 such as a photodiode so that a signal, the level of which corresponds to the power of the laser light beam, is supplied to the inverting input of the operational amplifier 22. This negative feedback enables the transistor Tr to control the reproduction driving current $I_R$ so that the power of the laser light beam emitted from the laser device 23 is maintained to a predetermined level.

Because the optical output level of the semiconductor laser device 23 is influenced by the change in temperature, it is not sufficient for maintaining the output power of a laser light beam at a fixed value to control the reproduction driving current $I_R$ at a constant level. This will be described in more detail, with reference to FIG. 8. When the temperature changes, the I-P (driving current-optical output power) characteristic of the semiconductor laser device 23 greatly changes, for example, from curve A to curve B. In accordance with curve A, a fixed optical output level $P_R$ can been obtained by supplying a reproduction driving current $I_{R1}$ to the laser device 23. When the temperature rises, the I-P characteristic of the laser device 23 changes as shown by the curve B, resulting in that a greater reproduction driving current $I_{R2}$ is necessary for obtaining the optical output level $P_R$. In order to maintain the optical output level $P_R$ at a constant level, therefore, the reproduction driving current $I_{R2}$ must be controlled while monitoring the optical output level $P_R$.

When the recording and erasing mode is set, the reproduction driving current $I_R$ is fixed to a level which is same as the one at the time immediately before setting the mode, by a sample hold circuit (not shown). A record and erasing signal circuit 25 produces a recording and erasing signal. In accordance with the recording and erasing signal, another switch circuit 26 is closed or opened. When the switch circuit 26 is closed, a record and erase driving current $I_W$ flows through the semiconductor laser device 23 while being superposed on the reproduction driving current $I_R$. Consequently, when information is recording, the laser light beam emitted from the laser device 23 is modulated in accordance with information to be recorded. When information is erasing, the switch circuit 26 remains to be closed to allow the record and erase driving current $I_W$ to flow through the laser device 23.

The amount of the record and erase driving current $I_W$ changes in accordance with the resistance value of the resistor circuit 28 which is selected by a selection circuit 27. The selection circuit 27 has four switches which can be selectively closed or opened in response to a selection signal supplied from an optical output power selection signal circuit 29. The resistor circuit 28 has four resistors $R_1$ to $R_4$ which have a different resistance value and are respectively connected in parallel to the four switches of the selection circuit 27. The selection signal circuit 29 detects the position of an optical disk on which the laser light beam of the laser device 23 is irradiated, i.e., the distance between this position and the center of the disk (hereinafter, such a position is referred to as "an irradiated position"), and produces the selection signal which corresponds to the detected position. The signal circuit 29 produces the selection signal so that the level of the record and erase driving current $I_W$ becomes greater as the irradiated position moves outwards (i.e., towards the outer periphery of the disk).

The reason why the level of the record and erase driving current $I_W$ changes in accordance with the irradiated position is that, when an optical disk rotates at a constant angular velocity, the linear velocity of the irradiated position becomes faster as the irradiated position moves outwards. In other words, in order that the energy of the laser light beam given to the magnetic thin film is kept constant regardless of the irradiated position, it is necessary to increase the optical output power of the laser light beam as the irradiated position moves outwards. The resistors $R_1$ to $R_4$ are selected by the selection circuit 27 so as to increase stepwise the record and erase driving current $I_W$ as the irradiated position moves outwards.

A semiconductor laser driving apparatus having such a configuration is described in the Japanese Laid-Open Patent Publication (kokai) No. 62(1987)-257,640.

Thus, in a conventional semiconductor laser driving apparatus, the level of the record and erase driving current $I_W$ which is superposed on the reproduction driving current $I_R$ is always constant as far as the irradiated position remains still.

Figure 8:
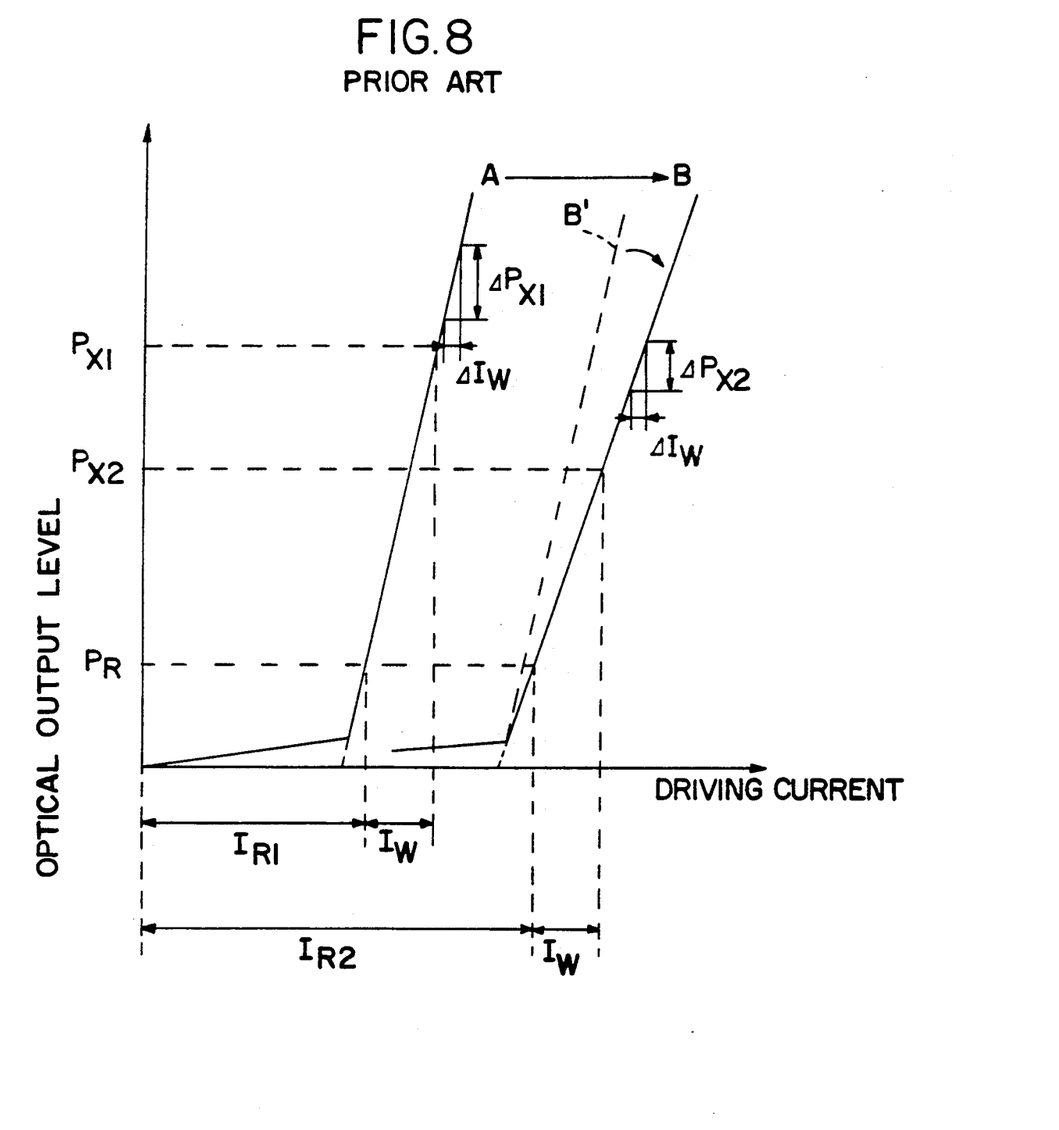
FIG. 8 is a graph of the I-P characteristic curve in the apparatus of FIG. 7.

As mentioned above, the I-P characteristic of the semiconductor laser device 23 changes when the temperature rises. The change of the I-P characteristic due to the temperature change is not a mere shift of the characteristic curve (e.g., from curve A to curve B' as shown in FIG. 8), but is one which includes the change in the slope of the characteristic curve (e.g., from curve A to curve B as shown in FIG. 8). When the I-P characteristic is changed from curve A to curve B, the differential efficiency is reduced from $\Delta P_{X1}/\Delta I_W$ to $\Delta P_{X2}/\Delta I_W$. If, according to the characteristic curve A, a predetermined optical output level $P_{X1}$ has been obtained by superposing the record and erase driving current $I_W$ on the reproduction driving current $I_{R1}$, the temperature rise causes the laser device 23 to operate in accordance with curve B, resulting in that the optical output reaches only the output level $P_{X2}$, even when the record and erase driving current $I_W$ is superposed on a reproduction driving current $I_{R2}$ which maintains the optical output level $P_R$ for the reproduction at a constant value. This is caused by the reduction in the optical output of the laser device which is due to the decrease in the differential efficiency. When the temperature falls, conversely, the optical output level of the laser device 23 may be excessively increased.

In this way, a prior art semiconductor laser driving apparatus cannot cope with the change in the differential efficiency of the I-P characteristic of a semiconductor laser device, and has a drawback that it cannot control the laser device to emit the laser light beam having the optimum power.

As the differential efficiency may differ depending upon individual semiconductor laser devices even at the same temperature, a prior art semiconductor laser driving apparatus has another drawback in that the combinations or resistance values of the resistors $R_1$ to $R_4$ in the resistance circuit 28 need to be initially adjusted for each apparatus.

The above-mentioned drawbacks are generally applicable to a semiconductor laser driving apparatus for other optical disk systems including those for a write-once type optical disk.

SUMMARY OF THE INVENTION

The semiconductor laser driving apparatus of this invention, which overcomes the above-discussed and numerous other disadvantages and deficiencies of the prior art, supplies a driving current to a semiconductor laser device of an optical disk recording and reproducing system, the level of which is changed to adjust the optical output of the semiconductor laser device to one of plural levels corresponding to positions of an optical disk which is irradiated by a laser beam emitted from said laser device, and comprises: a current supplying means for sequentially supplying plural reference driving currents having a different level to said laser device; a monitoring means for detecting the optical output level of said laser device when each of said reference driving currents is supplied to said laser device; a setting means for setting several optimum values on the basis of the detected optical output levels; and a selecting means for selecting one of said several optimum values, depending upon the position of an optical disk where is to be irradiated by a laser beam.

In a preferred embodiment, the current supplying means supplies a driving current corresponding to said selected optimum value for recording and erasing information.

In a preferred embodiment, the first current supplying means supply three or more kinds of reference driving currents before supplying said driving current for recording information.

In a preferred embodiment, the level of each of said three or more kinds of reference driving currents is gradually increased.

In a preferred embodiment, the first current supplying means supply two kinds of reference driving currents before supplying said driving current for recording information.

Thus, the invention described herein makes possible the objectives of (1) providing a semiconductor laser driving apparatus which can control a semiconductor laser device to emit a laser light beam of a desired power even when the temperature changes; and (2) providing a semiconductor laser driving apparatus in which it is not necessary to initially adjust the current limiting means such as resistors.

The driving currents may be supplied in such a manner that the level of each of the driving currents change step by step. The setting means may compare one by one the optical output levels monitored by the monitoring means with predetermined optical output levels which correspond to irradiated positions, respectively, and, when they substantially coincide with each other, a value corresponding to the driving current is set.

If the I-P characteristic of a semiconductor laser device can be deemed to be substantially linear, it may be sufficient to supply only two kinds of the driving currents the values of which are sufficiently different from each other. In this case, two optical output levels caused by the two driving currents are detected to form a line which represents the I-P characteristic of the laser device. Values corresponding to driving currents for generating a laser light beam of a predetermined optical output level can be set from the line.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
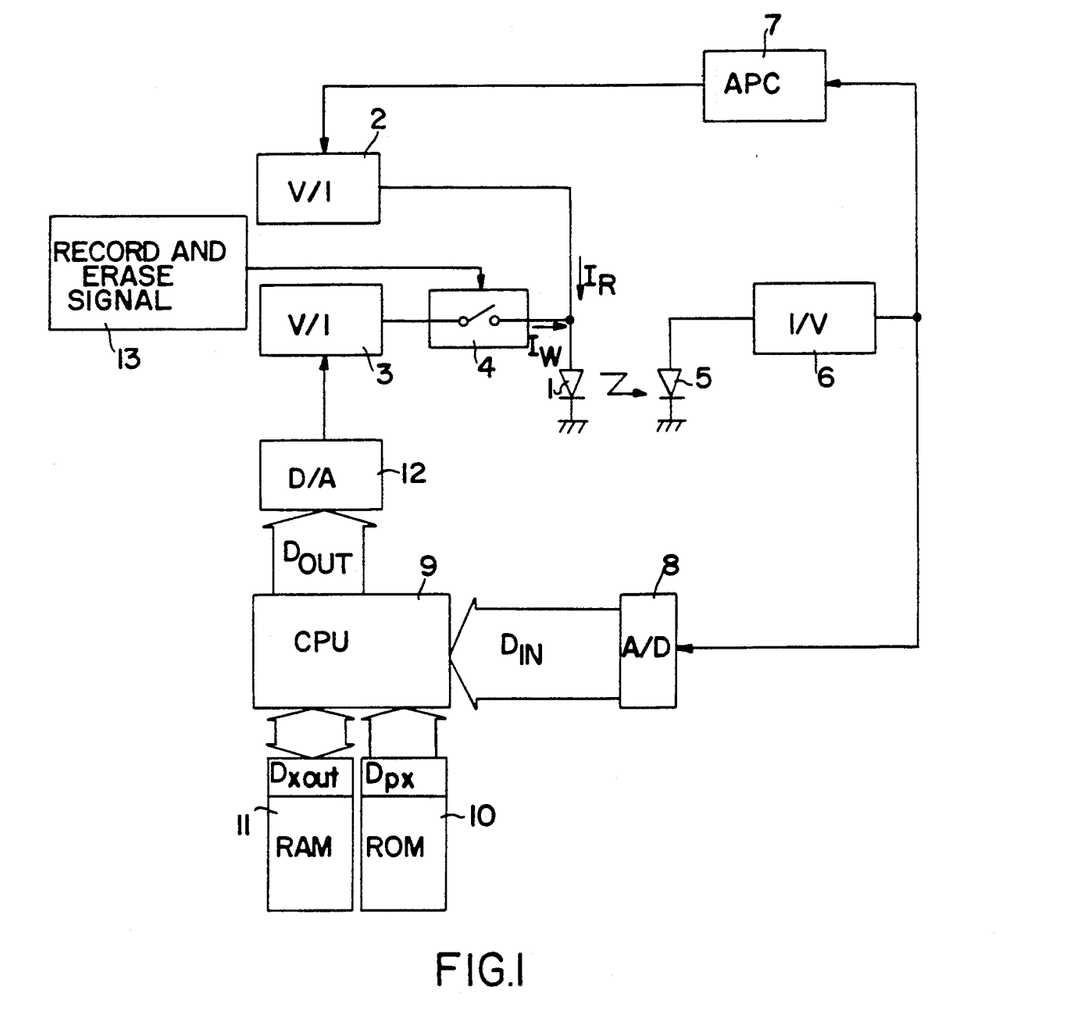
FIG. 1 is a block diagram showing a semiconductor laser driving apparatus of the invention.

FIG. 1 shows a semiconductor laser driving apparatus according to the invention. In the apparatus of FIG. 1, a semiconductor laser device 1 is driven by the reproduction driving current $I_R$ supplied from a reproduction current source (V/I) 2, and also by the record and erase driving current $I_W$ supplied via a switch circuit 4. The laser light beam emitted from the laser device 1 is monitored by an optical detecting element 5. The output of the optical detecting element 5 is supplied to an automatic power control (APC) circuit 7 through an I/V converter 6. The output of the APC circuit 5 is supplied to the reproduction current source 2 to form a loop for feedbacking the optical output level of the laser device 1, thereby enabling the laser device 1 to generate the optical output level $P_R$ for the reproduction having a predetermined value.

The output of the I/V converter 6 is also connected to an A/D converter 8 which converts the optical output level detected by the optical detecting element 5 into digital data $D_{in}$. The digital data $D_{in}$ is supplied to a CPU 9. The CPU 9 to which a ROM 10 and RAM 11 are connected produces digital data $D_{out}$ to supply it to a D/A converter 12. The D/A converter 12 converts the digital data $D_{out}$ into a voltage value which is supplied to a record and erase driving current source (V/I) 3. Consequently, the CPU 9 can monitor the optical output of the laser device 1 generated when the record and erase driving current $I_W$ is supplied to the laser device 1.

To the control input of the switch circuit 4, the output of a record and erasing signal circuit 13 is connected so that the switch circuit 4 is closed or opened according to the record and erasing signal supplied from the circuit 13. When the switch circuit 4 is closed, the record and erase driving current $I_W$ is supplied to the laser device 1. When the recording and erasing mode is set, the reproduction driving current $I_R$ is fixed to a level which is same as the one at the time immediately before setting the mode, by a sample hold circuit (not shown). The record and erase driving current $I_W$ flows through the semiconductor laser device 1 while being superposed on the reproduction driving current $I_R$.

Figure 2:
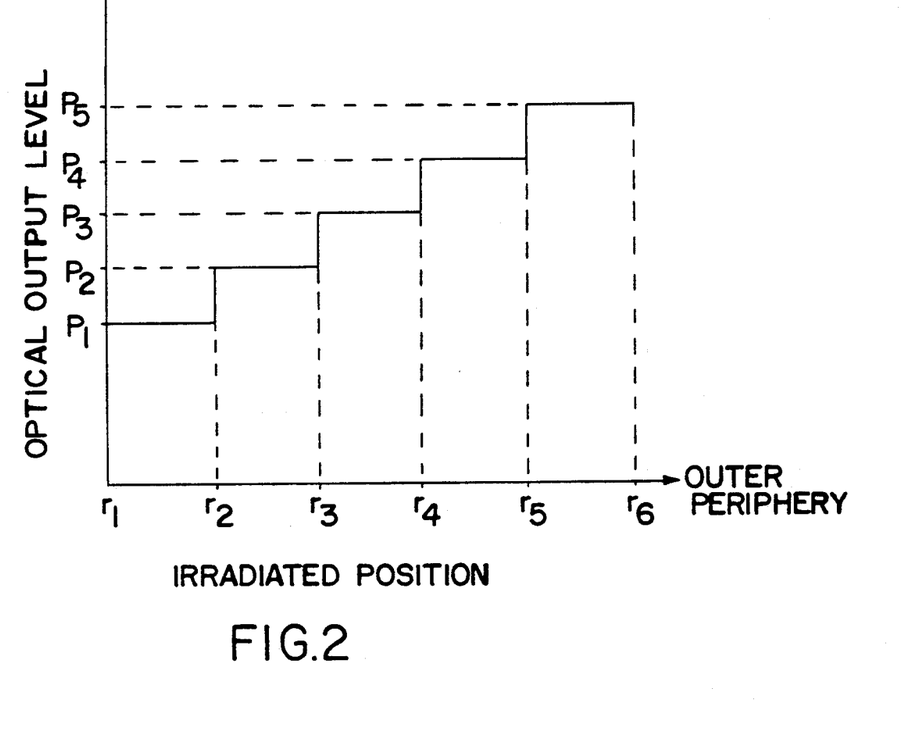
FIG. 2 is a diagram for illustrating an example of the relationship between irradiated positions and optical output levels.

The ROM 10 stores five digital data $D_{P1}$ to $D_{P5}$ ($D_{Px}$) which correspond respectively to predetermined optical output levels $P_1$ to $P_5$ ($P_x$). As shown in FIG. 2, these predetermined levels $P_1$ to $P_5$ ($P_x$) indicate the optimum optical output levels of the laser device 1 at each of the irradiated positions in the recording and erasing operation by the semiconductor laser element 1. Namely, the laser device 1 emits a laser light beam of the optical output level $P_1$ when the irradiated position is in the range between radius $r_1$ and radius $r_2$ of an optical disk, a laser light beam of the optical output level $P_2$ when the irradiated position is in the range between radius $r_2$ and radius $r_3$, and a laser light beam of the optical output level $P_5$ when the irradiated position is in the range between radius $r_5$ and radius $r_6$. These predetermined levels are selected so that the optical energy supplied to the medium of the optical disk is optimum when the laser light beams of such levels impinge on the respective irradiated position.

The RAM 11 stores five digital data $D_{Xout}$ which respectively correspond to five levels of the record and erase driving current $I_W$ for obtaining the five kinds of the optical output levels $P_X$. The CPU 9 selects one of the digital data $D_{Xout}$ in accordance with the present irradiated position, and read it out from the RAM 11. The selected one of the digital data $D_{Xout}$ is supplied as the digital data $D_{out}$ to the record and erase driving current source 3 so that the laser device 1 emits a laser light beam of the optimum optical power level $P_X$.

In the preferred embodiment, the digital data $D_{Xout}$ are automatically set according to the temperature conditions and the I-P characteristics of the semiconductor laser device 1, preferably, immediately before the recording and erasing operation. Two examples of the manner of modifying the digital data $D_{Xout}$ will be described.

Figure 3:
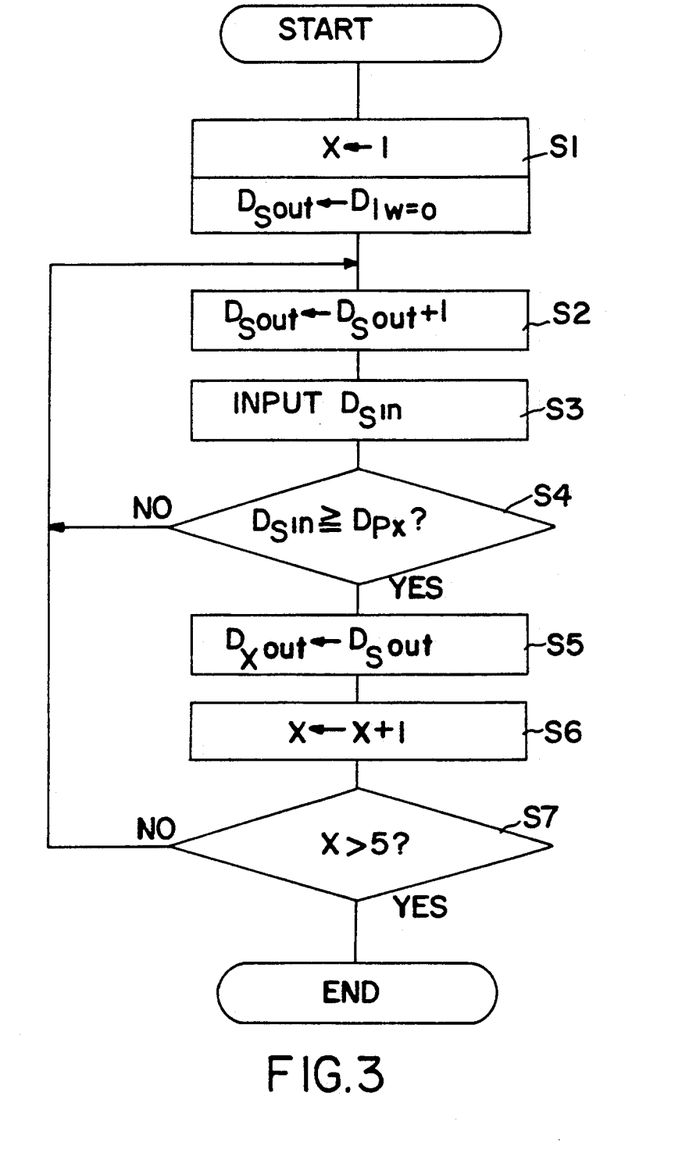
FIG. 3 is a flow chart of a first example of the automatic setting of digital data.
Figure 4:
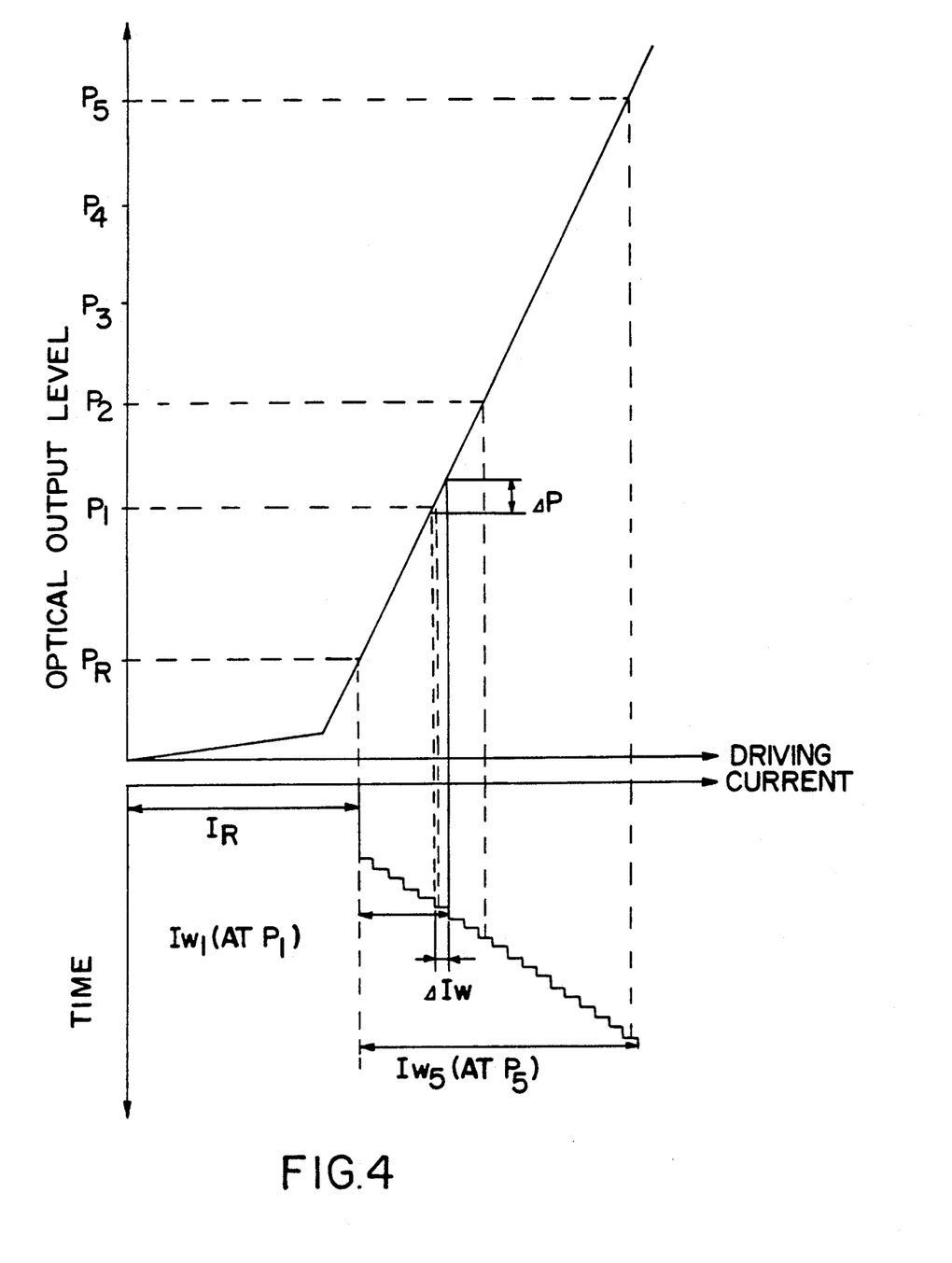
FIG. 4 is a graph of the I-P characteristic curve in the automatic setting of digital data shown in FIG. 3.

FIG. 3 shows the flow chart of the first example. In this example, the automatic setting of the digital data $D_{Xout}$ is performed immediately before the recording and erasing operation. In step S1, a loop counter X is set to one, and the digital data $D_{Sout}$ is initialized to the data $D_{IW=0}$ which is selected so that, when it is supplied to the record and erase driving current source 3 via the D/A converter 12, the record and erase driving current $I_W$ becomes zero. In this step, therefore, the semiconductor laser device is driven only by the reproduction driving current $I_R$ to generate a laser light beam of the level $P_R$, as shown in FIG. 4.

Thereafter, the digital data $D_{Sout}$ is incremented by one level (step S2). The degree of this increment of this one level has been set to a value which is so small that it is within the permissible range of fluctuation within the optical output level of the laser light beam emitted from the laser device 1. This digital data $D_{Sout}$ is sent to the driving current source 3 via the D/A converter 12, thereby supplying the record and erase driving current $I_W$ the level of which corresponds to the digital data $D_{Sout}$. The CPU 9 receives digital data $D_{Sin}$ from the A/D converter 8 (step S3).

The CPU 9 compares the digital data $D_{Sin}$ with the digital data $D_{P1}$ ($D_{PX}$) stored in the ROM 10 (step S4). When the digital data $D_{Sin}$ is less than the digital data $D_{P1}$, the operation returns to step S2 to repeat the above-mentioned processes.

When the digital data $D_{Sin}$ reaches the digital data $D_{P1}$ as a result of the gradual increases of the digital data $D_{Sout}$ by repeating step S2, the value of the digital data $D_{Sin}$ with the digital data $D_{P1}$ at this time is set in the RAM 11 as digital data $D_{1out}$ ($D_{Xout}$) (step S5). This will be described in more detail with reference to FIG. 4. With the gradual increase of the digital data $D_{Sout}$, the record and erase driving current $I_W$ is increased by the step of $\Delta I_W$ to increase the optical output P by the step of $\Delta P$. When the optical output P becomes equal to or greater than the predetermined optical output level $P_1$, the digital data $D_{Sout}$ corresponding to the record and erase driving current $I_W$ at this instant (i.e., the record and erase driving current $I_{W1}$) is set as the digital data $D_{1out}$ ($D_{Xout}$) in the RAM 11.

After the digital data $D_{Xout}$ is set, the loop counter X is incremented by one (step S6), and it is checked to see whether the loop counter X exceeds five or not (step S7). When the loop counter X is less than five, the operation returns again to step S2 to repeat the processes. When the loop counter X reaches five (i.e., all the digital data $D_{1out}$ to $D_{5out}$ ($D_{Xout}$) have been set in the RAM 11), the automatic setting of the digital data $D_{Xout}$ has been completed.

After the automatic setting of the digital data $D_{Xout}$ has been completed, the apparatus starts the recording and erasing operation on the basis of the newly set digital data $D_{Xout}$.

Figure 5:
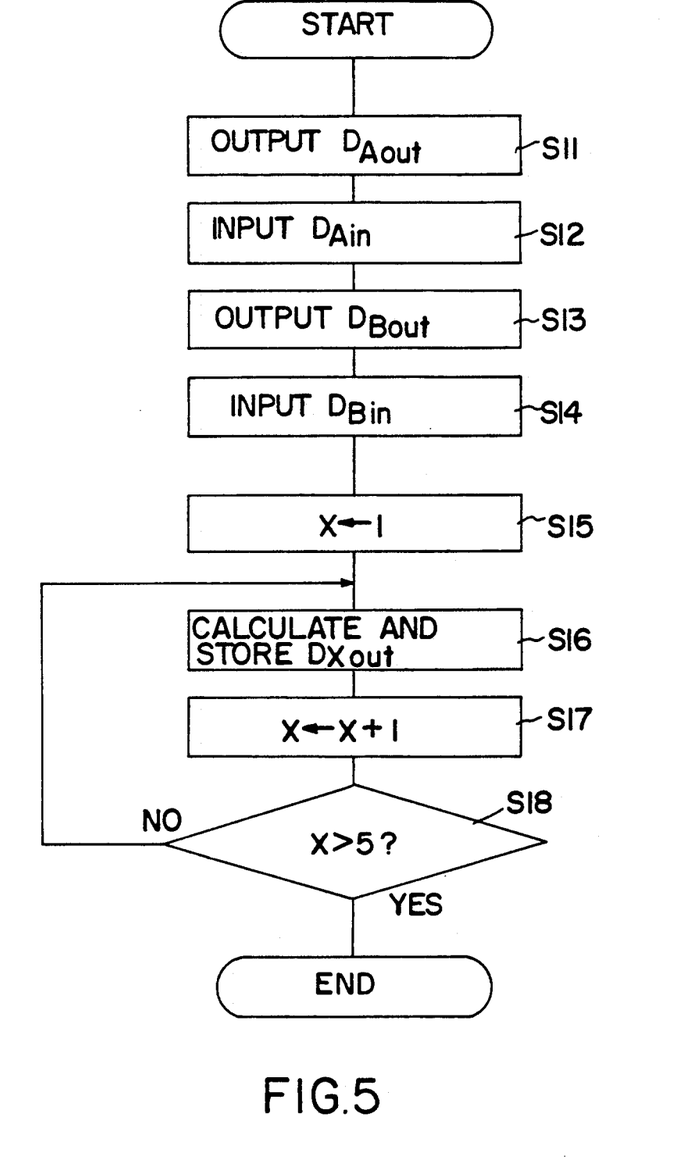
FIG. 5 is a flow chart of a second example of the automatic setting of digital data.
Figure 6:
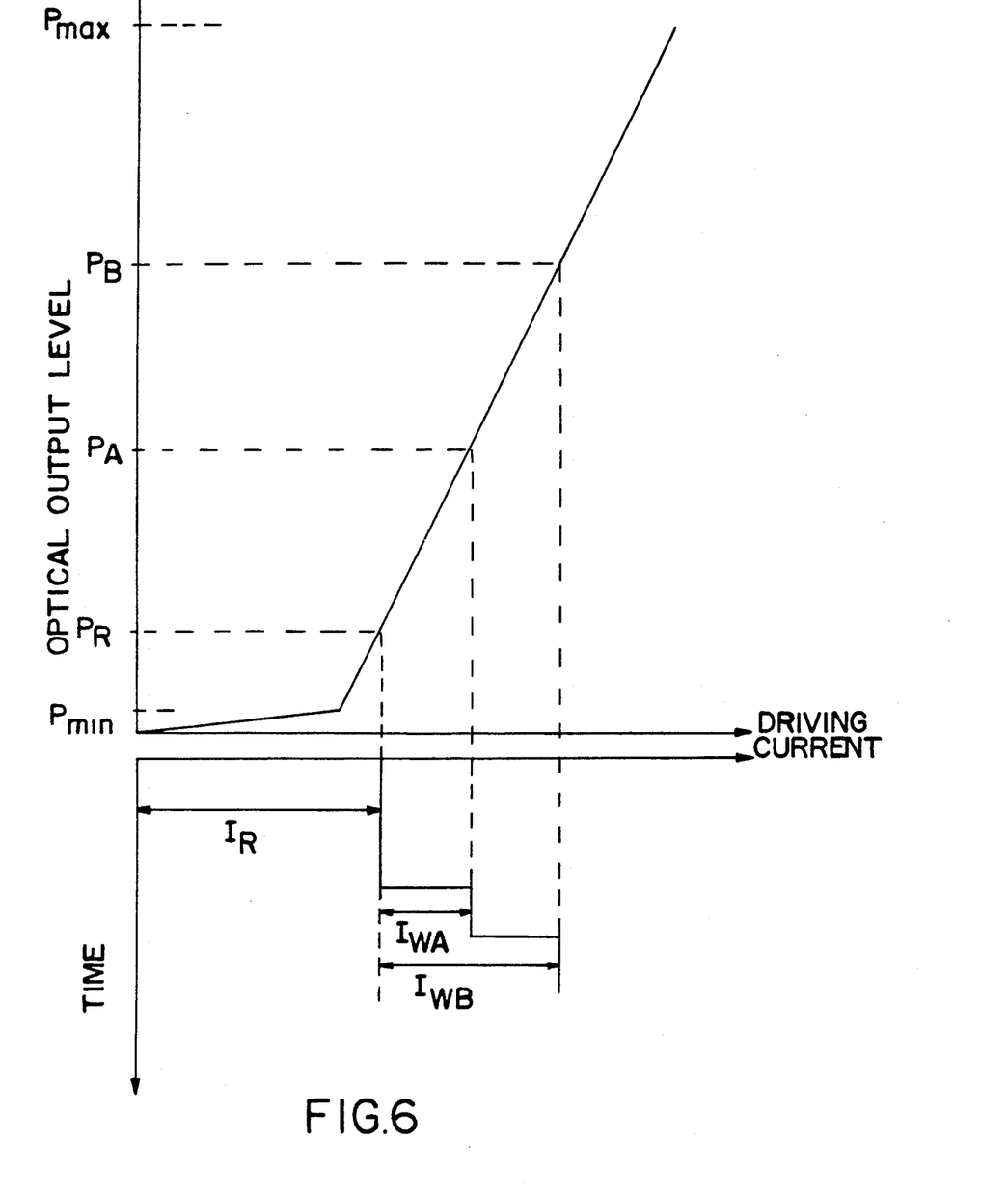
FIG. 6 is a graph of the I-P characteristic curve in the automatic setting of digital data shown in FIG. 5.

The second example of the automatic setting of the digital data $D_{Xout}$ will be described with reference to FIGS. 5 and 6. Also in this example, the automatic setting of the digital data $D_{Xout}$ is performed immediately before the recording and erasing operation. The CPU 9 sends digital data $D_{Aout}$ to the driving current source 3 via the D/A converter 12, thereby supplying the record and erase driving current $I_{WA}$ the level of which corresponds to the digital data $D_{Aout}$. As shown in FIG. 6, the digital data $D_{Aout}$ is a value corresponding to the record and erase driving current $I_{WA}$ for generating a laser light beam of the optical output level $P_A$ which is previously set within the range from $P_{min}$ to $P_{max}$. In this range from $P_{min}$ to $P_{max}$, the I-P characteristic curve of the semiconductor laser device 1 is substantially linear. The laser device 1 is driven by the reproduction driving current $I_R$ on which the record and erase driving current $I_{WA}$ is superposed, to emit a laser light beam of the optical output level $P_A$. The optical output level $P_A$ is detected by the I/V converter 6 to be input as digital data $D_{Ain}$ (step S12).

Then, the CPU 9 sends data $D_{Bout}$ to the driving current source 3 via the D/A converter 12, thereby supplying to the laser device 1 the record and erase driving current $I_{WB}$ the level of which corresponds to the digital data $D_{Bout}$ (step S13). The optical output level $P_B$ is previously set so that it is sufficiently greater than the optical output level $P_A$ in the linear range. The laser device 1 is driven by the reproduction driving current $I_R$ on which the record and erase driving current $I_{WB}$ is superposed, to emit a laser light beam of the optical output level $P_B$. The optical output level $P_B$ is converted by the A/D converter 8 to be input as digital data $D_{Bin}$ (step S14).

After the digital data $D_{Ain}$ and $D_{Bin}$ have been input, the loop counter X is set to one (step S15), and the operation enters into the loop of setting digital data $D_{Xout}$ (steps S16 to S18). In this loop, a digital data $D_{1out}$ is calculated from the digital data $D_{Ain}$ and $D_{Bin}$, as described later, and the obtained digital data $D_{1out}$ is set in the RAM 11 (step S16). The loop counter X is incremented (step S17), and the loop counter X is checked to see whether it is greater than five or not (step S18). When the loop counter X is not greater than five, the operation returns to step S16 to repeat the processes. When the loop counter X reaches five, in other words, all the digital data $D_{1out}$ to $D_{5out}$ ($D_{Xout}$) have been set in the RAM 11, the automatic setting of the digital data $D_{Xout}$ terminates.

In step S16, the digital data $D_{1out}$ to $D_{5out}$ ($D_{Xout}$) are calculated by the following expression, respectively for X of 1 to 5.

$$D_{XOUT} = \frac{(D_{BOUT} - D_{AOUT})}{(D_{BIN} - D_{AIN})} (D_{PX} - D_{PR})$$

where the term "$(D_{BOUT}-D_{AOUT})/(D_{BIN}-D_{AIN})$" means "$(I_{WB}-I_{WA})/(P_B-P_A)$", i.e., the reciprocal of a differential efficiency in the I-P curve. The symbol "$D_{PX}$" represents the digital data which correspond respectively to predetermined optical output levels $P_X$ shown in FIG. 2, and the symbol "$D_{PR}$" represents the digital data corresponding to the optical output level $P_R$ for the reproduction mode. Therefore, the term "$(D_{PX}-D_{PR})$" means $(P_X-P_R)$ or the optical output level which is to be superposed on the optical output level $P_R$ for the reproduction mode in order to obtain the optical output level $P_X$ for the recording and erasing mode. Summarizing the above, the right side of the expression is the multiplication of $(P_X-P_R)$ and the reciprocal of a differential efficiency, thereby obtaining the digital data $D_{Xout}$ corresponding to the record and erase driving current $I_{WX}$ which should be superposed to the reproduction driving current $I_R$.

The initial digital data $D_{IW-0}$ may be used as the digital data $D_{Aout}$ produced in step S11. In this case, the record and erase driving current $I_W$ becomes zero so that the optical output level $P_A$ coincides with the the reproduction driving current $I_R$ in the reproduction mode.

Also in this example, after the automatic setting of the digital data $D_{Xout}$ has been completed, the apparatus starts the recording and erasing operation on the basis of the newly set digital data $D_{Xout}$.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser driving apparatus for supplying a driving current to a semiconductor laser device of an optical disk recording and reproducing system, the level of which is changed to adjust the optical output of the semiconductor laser device to one of plural levels corresponding to positions of an optical disk which is irradiated by a laser beam emitted from said laser device, said apparatus comprises:

a current supplying means for sequentially supplying plural reference driving currents having a different level to said laser device;

a monitoring means for detecting the optical output level of said laser device when each of said reference driving currents is supplied to said laser device;

a setting means for setting several optimum values on the basis of the detected optical output levels; and a selecting means for selecting one of said several optimum values, depending upon the irradiated position on the irradiated optical disk.

2. An apparatus according to claim 1 wherein said current supplying means supplies a driving current for recording and erasing information.

3. An apparatus according to claim 1 wherein said current supplying means for sequentially supplying said plural reference currents comprises means for supplying a sequence of currents comprising said driving current followed by three or more kinds of reference driving currents.

4. An apparatus according to claim 3 wherein the level of each of said three or more kinds of reference driving currents is gradually increased.

5. An apparatus according to claim 1 wherein said current supplying means for sequentially supplying said plural reference currents comprises means for supplying a sequence of currents comprising said driving current followed by two kinds of reference driving currents.

* * * * *